United States Patent [19]

Keeney

[11] 4,225,795
[45] Sep. 30, 1980

[54] COINCIDENCE CIRCUIT FOR A PROTECTIVE RELAY CIRCUIT

[75] Inventor: Marvin F. Keeney, Springfield, Pa.

[73] Assignee: General Electric Company, Philadelphia, Pa.

[21] Appl. No.: 911,004

[22] Filed: May 30, 1978

[51] Int. Cl.² .............................................. H03K 5/13
[52] U.S. Cl. .................................. 307/232; 307/218; 307/355; 307/362; 328/110; 328/133; 361/86; 361/187
[58] Field of Search ............... 307/350, 354, 355, 357, 307/362, 364, 218, 232, 210; 328/94, 110, 117, 133, 147; 361/79, 86, 187; 340/661–663

[56] References Cited

U.S. PATENT DOCUMENTS

| | | | |
|---|---|---|---|
| 3,286,176 | 11/1966 | Birnboim | 324/83 D |
| 3,629,713 | 12/1971 | Szpilka | 328/147 X |
| 3,778,723 | 12/1973 | Schaefer | 328/133 |
| 3,798,557 | 3/1974 | Scott et al. | 328/133 |
| 3,832,690 | 8/1974 | McVoy et al. | 340/158 R |
| 3,935,512 | 1/1976 | Falk et al. | 361/86 |
| 3,976,919 | 8/1976 | Vandevier et al. | 361/96 |
| 4,028,686 | 6/1977 | Wilson et al. | 340/195 |
| 4,034,269 | 7/1977 | Wilkinson | 361/79 |

OTHER PUBLICATIONS

Instructions, Printed Circuit Cards for Mod III Static Relay Equipment (GEK-34158-A) dated 9–76 p. 16 and section L.

Primary Examiner—John Zazworsky
Attorney, Agent, or Firm—William Freedman; Carl L. Silverman

[57] ABSTRACT

The coincidence circuit includes negative and positive signal processing means. The negative and positive signal processing means each includes level detector circuit means for developing separate level detector output signals for each one of a plurality of a-c input signals when each one of the plurality of a-c input signals is of a negative or positive value respectively greater than predetermined negative or positive threshold levels. The predetermined threshold levels are of different magnitude for at least some of the a-c input signals. AND circuit means is coupled to receive the level detector output signals of the negative and positive signal processing means for developing AND circuit output signals respectively representative of negative and positive phase coincidence of the a-c input signals with threshold level attainment. OR circuit means is coupled to receive the AND circuit output signals for developing an OR output signal continuously representative of the phase coincidence of the a-c input signals. The coincidence circuit operates directly from a-c input signals of relatively low signal strength. In a preferred embodiment, a plurality of comparators are employed to receive four a-c input signals for use in a ground distance protective relaying application. In this embodiment, the predetermined threshold levels are in the millivolt range. Other embodiments are disclosed.

11 Claims, 8 Drawing Figures

COINCIDENCE CIRCUIT FOR A PROTECTIVE RELAY CIRCUIT

BACKGROUND OF THE INVENTION

This invention relates to a coincidence circuit, and more particularly to such a circuit for use with a.c. input signals in protective relaying applications.

As a result of advancements in solid state technology, static relays have been developed which employ a phase comparator method of measurement. Exemplary circuits for phase comparator static relays are disclosed in U.S. Pat. No. 4,034,269, Wilkinson, entitled "Protective Relay Circuits", issued July 5, 1977. The patent is assigned to the assignee of the present invention and is hereby incorporated by reference in the present application.

In the phase comparator method of measurement, the relay operates by measuring the angle between two or more phasors derived within the relay. Briefly, this is accomplished by the use of an a.c. coincidence circuit in combination with a timer circuit. For example, in the case of the phase distance relay of FIGS. 6 and 7 of previously referenced U.S. Pat. No. 4,034,269, a coincidence detector 286 develops an output signal when phase coincidence exists between a polarizing signal ($V_{AB}$) and an operating signal ($I_{AB}Z_R - V_{AB}$). A timer 288 then measures the duration of the phase coincidence and develops an output signal when phase coincidence occurs for a predetermined minimum time equal to the relay operate time. It is to be appreciated that, for faults within the intended reach of the relay, the phase coincidence is greater than $\frac{1}{4}$ cycle. Thus, for 60 cycle protective relaying applications, where $\frac{1}{4}$ cycle equals 4.167 ms, the timer is ordinarily set at 4.167 ms.

Although a.c. coincidence circuits are presently available for the above-described protective relaying application, such coincidence circuits present several difficulties. One such difficulty is that available coincidence circuits for protective relaying applications generally require square wave input signals of considerable signal strength. For example, such a-c input signals generally must be greater than $7\frac{1}{2}$ volts rms. This means that the a.c. input signals whose coincidence is to be determined must generally be processed with additional circuitry before coupling to the coincidence circuit. In protective relaying applications, the a.c. input signals are generally in sinusoidal form so the additional circuitry typically is in the form of a squaring amplifier. This additional processing circuitry is undesirable for cost and space reasons. Another difficulty with available coincidence circuits for protective relaying applications is that there is no provision for convenient threshold level adjustments of phase coincidence. The above-cited difficulties are made more serious for those protective relaying applications in which the phase coincidence of more than two a.c. input signals is to be determined.

Accordingly, it is a general object of this invention to provide a coincidence circuit for protective relaying applications which operates directly from a.c. input signals of relatively low signal strength.

It is another object of this invention to provide such a coincidence circuit which provides simple threshold level adjustments.

It is another object of this invention to provide such a coincidence circuit for use with at least three a.c. input signals.

It is another object of this invention to provide such a coincidence circuit for protective relaying applications which includes switching means for determining the same phase or opposite phase coincidence of the a.c. input signals.

SUMMARY OF THE INVENTION

In one form of the present invention, I provide a coincidence circuit for a protective relay circuit in which the coincidence circuit receives a plurality of a-c input signals and develops a coincidence output signal representative of the phase coincidence of the plurality of a-c input signals.

The coincidence circuit includes negative and positive signal processing means. The negative signal processing means includes first level detector circuit means for developing a separate first level detector output signal for each one of the plurality of a.c. input signals when each one of the plurality of a.c. input signals is of a negative value greater than a predetermined negative threshold value. The predetermined negative threshold value being of a different value for at least some of the a.c. input signals. First AND circuit means is provided for receiving the first level detector output signals and developing a first AND output signal representative of negative phase coincidence of the plurality of a.c. input signals wherein the plurality of a.c. input signals are each of a negative value greater than the predetermined negative threshold values. The positive signal processing means includes second level detector circuit means for developing a separate second level detector output signal for each one of the plurality of a.c. input signals when each one of the plurality of a.c. input signals is of a positive value greater than a predetermined positive threshold value. The predetermined positive threshold value is of a different value for at least some of the a-c input signals. Second AND circuit means is provided for receiving the second level detector output signals and developing a second AND output signal representative of positive phase coincidence of the plurality of a.c. input signals wherein the plurality of a.c. input signals are each of a positive value greater than the predetermined positive threshold values.

OR circuit means is provided and is coupled to receive the first and second AND output signals for developing an OR circuit output signal in response to the first or second AND output signal, the OR circuit output signal being representative of the phase coincidence of the plurality of a.c. input signals wherein the predetermined negative and positive threshold values are exceeded for the respective negative and positive portions of the a.c. input signals.

BRIEF DESCRIPTION OF THE DRAWINGS

My invention will be more fully understood and its several objects and advantages further appreciated by referring now to the following description, taken in conjunction with the accompanying drawings, wherein:

FIG. 1A is a more detailed circuit diagram of one of the comparators of FIG. 1.

DETAILED DESCRIPTION OF THE INVENTION

Figure 1:
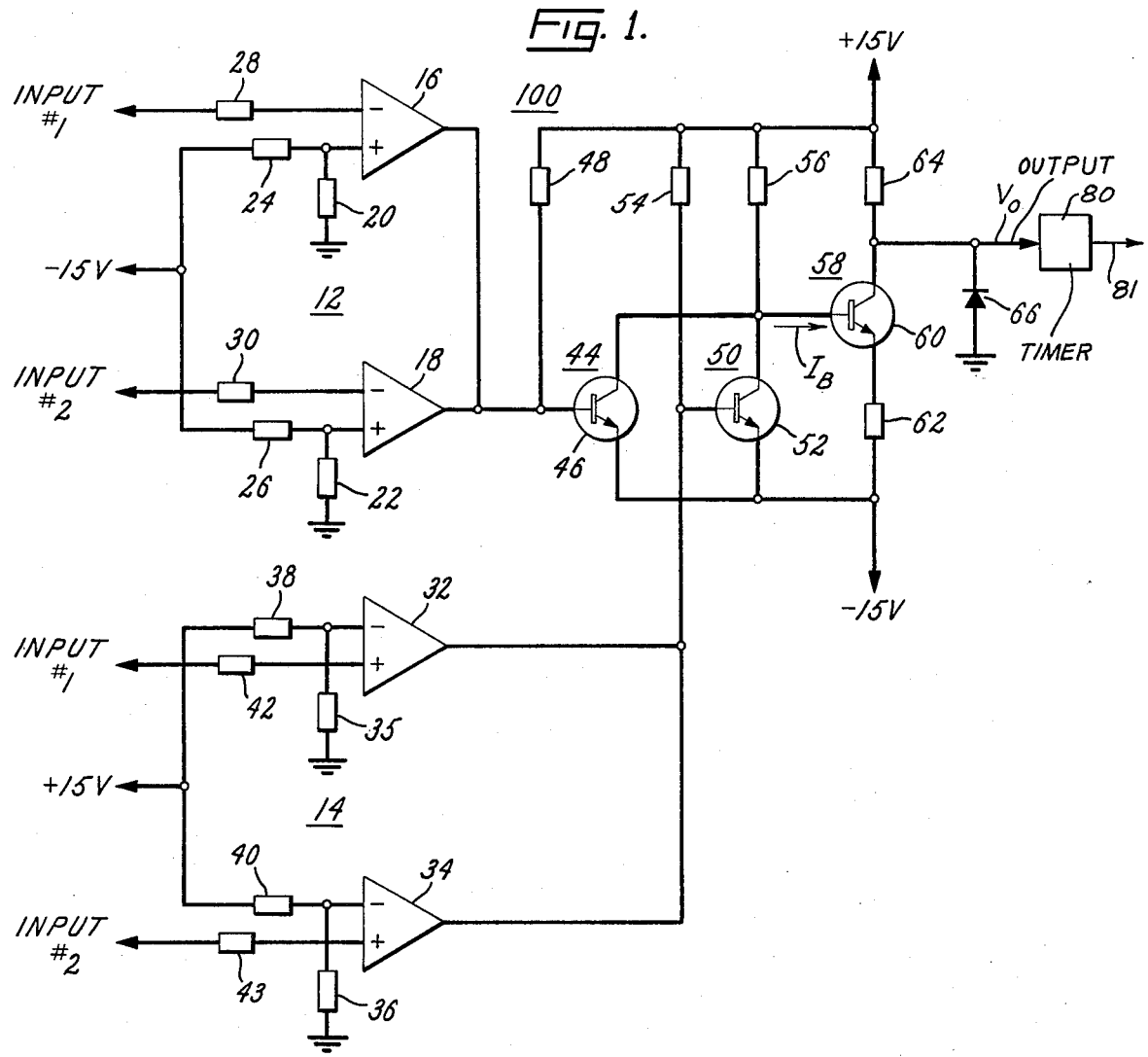
FIG. 1 is a circuit diagram for one simple form of a.c. coincidence circuit of the present invention.

Referring initially to FIG. 1, a simple two input a.c. coincidence circuit of the present invention is generally designated 100. The coincidence circuit 100 includes (i) negative signal processing circuit means 12 for developing an output signal representative of the negative phase coincidence of a.c. input signals #1 and #2 and (ii) positive signal processing circuit means 14 for developing an output signal representative of the positive phase coincidence of a.c. input signals #1 and #2.

Figure 2:
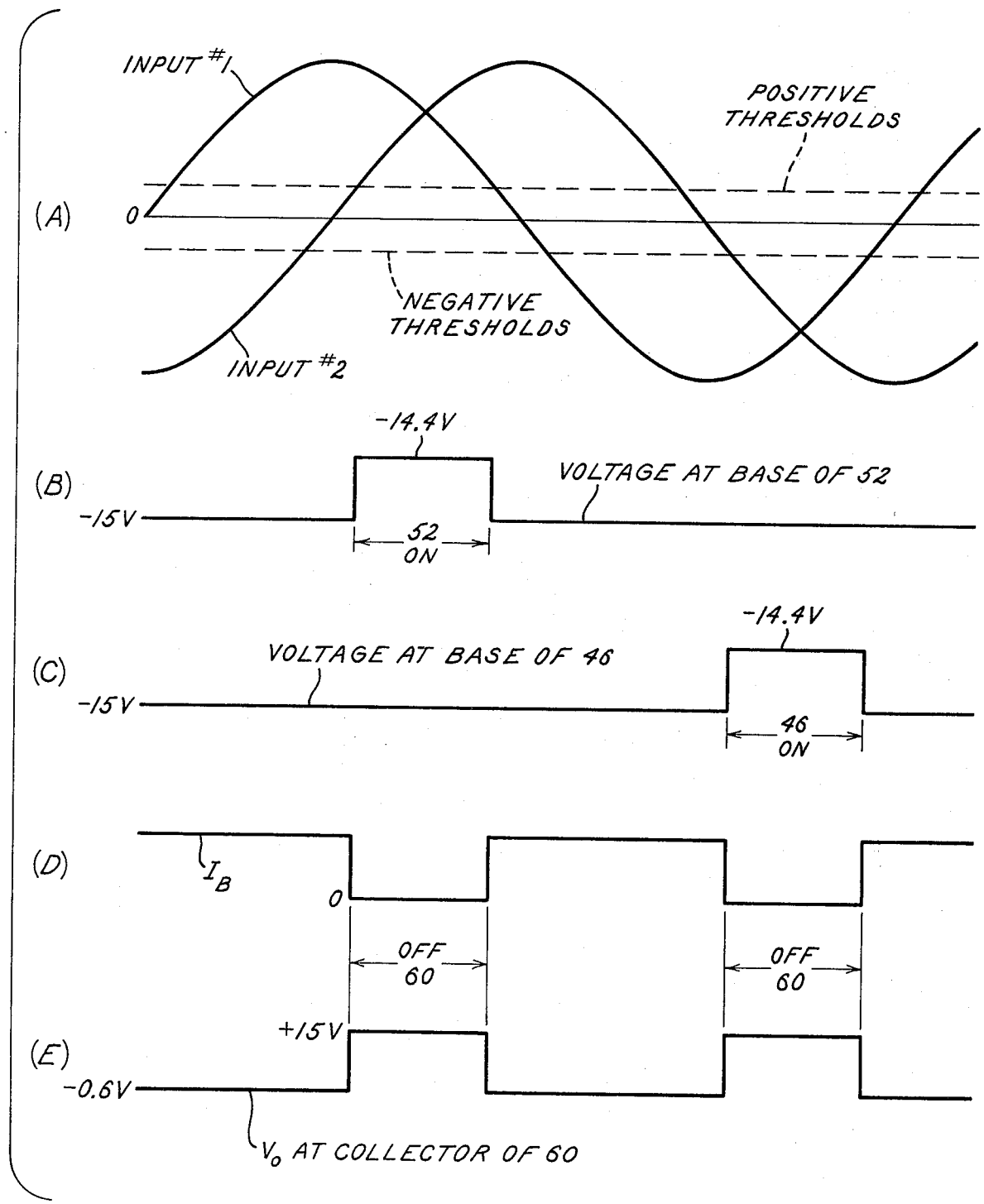
FIG. 2A–2E represent waveforms associated with the circuit diagram of FIG. 1.

In a preferred embodiment, the coincidence circuit 100 employs a plurality of comparators, such as the one commercially available from National Semiconductor Corp. under the designation LM239. Such a comparator is shown in FIG. 1A, and is similar to the one shown in FIG. 2 of the National Semiconductor Corp. Application Note, AN-74, of R. T. Smathers et al, dated January 1973. The comparator includes transistors Q1 through Q4 which make up a PNP Darlington differential input stage with transistors Q5, Q6 serving to give single-ended output from differential input with no loss in gain. An output stage is provided by transistors Q7, Q8. Current sources are simply designated $I_1$, $I_2$.

Referring now to FIGS. 1, 1A, the relationship between the comparator circuit configuration of FIG. 1A and the diagrammatic representation of the comparator of FIG. 1 will be discussed. In diagrammatic form (FIG. 1) the comparator includes an inverting input (−), a non-inverting input (+), and an output. The inverting input (−) corresponds to the input ($-V_{IN}$) to the base of transistor Q4. The non-inverting input (+) corresponds to the input ($+V_{IN}$) to the base of transistor Q1. The output of the comparator is the signal ($V_{OUT}$) appearing at the collector of output transistor Q8. The output signal ($V_{OUT}$) is −15 V dc when output transistor Q8 is conducting (on) and a more positive value when transistor Q8 is non-conducting (off).

The negative signal processing circuit means 12 comprises comparators 16 and 18 respectively for each one of the a.c. inputs #1 and #2. Each comparator 16, 18 includes a non-inverting input (+), an inverting input (−), and an output. The non-inverting inputs (+) of comparators 16, 18 are respectively coupled to a reference potential, such as ground potential, through resistors 20, 22. The non-inverting inputs (+) of comparators 16, 18 are also respectively coupled to a negative source of potential, e.g., −15 V dc, through resistors 24, 26. The inverting input (−) of comparator 16 is coupled through resistor 28 to receive a.c. input signal #1. The inverting input (−) of comparator 18 is coupled through resistor 30 to receive a.c. input signal #2. The outputs of comparators 16, 18 are coupled together, i.e., connected in parallel. In the negative signal processing circuit means 12, each of the comparators 16, 18 functions as a level detector. More particularly, the output of comparator 16 or 18 is −15 V dc when a predetermined negative threshold value is not attained. As the outputs of comparators 16, 18 are coupled together, if one of the comparator outputs is at −15 V dc, their coupled output is clamped to −15 V dc. When the predetermined negative threshold is attained, the output transistor of comparator 16 or 18 goes off. As the outputs of comparators 16, 18 are coupled together, their coupled output is off when the predetermined thresholds of comparators 16, 18 are attained. The predetermined negative threshold value is determined by the resistance values of resistors 20, 22, 24, 26 (R20, R22, R24, R26) and the magnitude of the negative voltage, e.g., −15 volts. More particularly, in the instant case, the predetermined negative threshold values for inputs #1 and #2 are respectively determined by: R20/R24+R20) (31 15 V); and R22/(R26+R22) (31 15 V).

The positive signal processing circuit means comprises comparators 32, 34, substantially the same as comparators 16, 18. The comparators 32, 34 have inverting inputs (−) respectively coupled to ground potential through resistors 35, 36. The inverting inputs (−) of comparators 32, 34 are also respectively coupled to a positive source of potential, e.g., +15 V dc, through resistors 38, 40. The non-inverting input (+) of comparator 32 is coupled through resistor 42 to receive a.c. input signal #1. The non-inverting input (+) of comparator 34 is coupled through resistor 43 to receive a.c. input signal #2. The outputs of comparators 32, 34 are coupled together, i.e., connected in parallel. As in the negative signal processing circuit means 12, in the positive signal processing circuit means 14, each of the comparators 32, 34 functions as a level detector, with its output transistor being conducting and producing an output signal of −15 V dc when a predetermined positive threshold value is not attained and the output transistor being non-conducting (off) when the positive threshold value is attained. The comparers 32, 34 are coupled together in a manner similar to the comparators 16, 18 so their coupled output functions in a similar manner. The positive threshold value is determined by the resistance values of resistors 35, 36, 38, 40 (R35, R36, R38, R40), and the magnitude of the positive voltage, e.g., +15 volts. More particularly, in the instant case, the predetermined positive threshold values for inputs #1 and #2 are respectively determined by: R35/(R38+R35) (+15 V); and R36/(R36+R40) (+15 V).

The outputs of comparators 16, 18 are coupled to first AND circuit means 44 which includes an NPN transistor 46. The base of the NPN transistor 46 is coupled to receive the coupled outputs of comparators 16, 18. The junction between the comparators 16, 18 and the base of transistor 46 is coupled through resistor 48 to a source of positive potential, e.g., +15 V dc. The emitter of transistor 46 is coupled to a negative source of potential, e.g., −15 V dc.

The outputs of comparators 32, 34 are coupled to second AND circuit means 50 which includes an NPN transistor 52. The base of NPN transistor 52 is coupled to receive the coupled outputs of comparators 32, 34. The junction between the base of NPN transistor 52 and the comparators 32, 34 is coupled through resistor 54 to the source of positive potential. The emitter of transistor 52 is coupled to the source of negative potential. The collector of transistor 52 is coupled to the collector of transistor 46. The coupled collectors of transistors 46, 52 are coupled through resistor 56 to the source of positive potential.

The collectors of NPN transistors 46, 52 are coupled to OR circuit 58 which includes NPN transistor 60. The base of NPN transistor 60 is coupled to the collectors of NPN transistors 46, 52. The emitter of NPN transistor 60 is coupled through resistor 62 to the negative source of potential. The collector of NPN transistor 60 is coupled through resistor 64 to the positive source of potential. The collector of NPN transistor 60 is coupled to ground potential through clamping diode 66. The signal at the collector of NPN transistor 60 is the output signal $V_O$ of the coincidence circuit 100. The output signal $V_O$ is representative of the phase coincidence of a.c. input signals #1 and #2. This output signal Vo is coupled to a timer 80 corresponding to the timer 288 of FIG. 6 of the aforesaid Wilkinson U.S. Pat. No. 4,034,269.

OPERATION OF THE CIRCUIT 100 of FIG. 1

Referring now to FIGS. 2A–2E, the operation of the coincidence circuit 100 will be described for the situation shown in FIG. 2A in which a.c. input signals #1 and #2 are approximately 90° out of phase.

The #1 and #2 a.c. input signals to the positive signal processing circuit means 14 are processed as follows. Comparator 32 produces a −15 V dc output as long as the #1 a.c. input signal at its non-inverting input (+) is less positive than the predetermined positive threshold value, i.e., R35/(R35+R38) (+15 V). This predetermined positive threshold value is shown in FIG. 2A as a dashed line. When the #1 a.c. input signal attains the positive threshold value, the output transistor of comparator 32 turns off. Similarly, comparator 34 produces a −15 V dc output as long as the #2 a.c. input signal at its non-inverting input (+) is less positive than the predetermined positive threshold value, i.e., R36/(R36+R40) (+15 V). When the #2 a.c. input signal attains this positive threshold value, the output transistor of comparator 34 turns off. When the output transistors of comparators 32, 34 both turn off, the coupled input to the base of NPN transistor 52 is no longer at −15 V dc. If neither, or only one such comparator output transistor is off, the coupled input to the base of transistor 52 is caused to be −15 V dc.

The #1 and #2 a.c. input signals to the negative signal processing circuit means 12 are processed as follows. Comparator 16 produces a −15 V dc output as long as the #1 input signal at its inverting input (−) is less negative than a predetermined negative threshold value, i.e., R20/(R20+R24) (−15 V). This predetermined negative threshold value is shown in FIG. 2A as a dashed line. When the #1 a.c. input signal attains this negative threshold value, the output transistor of comparator 16 turns off. Similarly, comparator 18 produces −15 V dc output as long as the #2 a.c. input signal is less negative than the predetermined negative threshold value, i.e., R22/(R26+R22) (−15 V). When the #2 a.c. input signal attains this negative threshold value, the output transistor of comparator 18 turns off.

The NPN transistor 52 of second AND circuit means 50 has its base coupled to the outputs of comparators 32, 34. The base of NPN transistor 60 is also coupled through resistor 56 to the positive voltage source. As long as a.c. input signals #1 and #2 do not both attain the predetermined positive thresholds at the non-inverting inputs (+) of comparators 32, 34, the coupled output of comparators 32, 34 is at −15 V dc. Hence, the base of NPN transistor 52 is also at −15 V dc. This causes NPN transistor 52 to be non-conducting. When the output transistors of comparators 32, 34 both go off, indicating positive phase coincidence and positive threshold attainment, NPN transistor 52 goes into a conducting state at which time the base of NPN transistor 52 is slightly less negative than −15 V dc, due to the base-emitter voltage drop, FIG. 2B.

The NPN transistor 46 of first AND circuit means 44 has its base coupled to the output signals of comparators 16, 18 and the base of NPN transistor 46 is also coupled through resistor 48 to the positive voltage source. As long as a.c. input signals #1 and #2 do not both attain the predetermined negative thresholds at the inverting inputs (−) of comparators 16, 18 the coupled output of comparators 16, 18 causes the base of NPN transistor 46 to be at −15 V dc. This causes NPN transistor 46 to be non-conducting. When the output transistors of comparators 16, 18 both go off, indicating negative phase coincidence and negative threshold attainment, NPN transistor 46 goes into a conducting state at which time the base of transistor 46 is slightly less negative than −15 V dc, due to the base-emitter voltage drop, FIG. 2C.

The normal condition, i.e., no signal inputs, of NPN transistors 46, 52 is non-conducting. As long as NPN transistors 46, 52 are non-conducting (indicating no phase coincidence with attainment of threshold level), the NPN transistor 60 of OR circuit 58 is in a conducting state, FIG. 2E. In this conducting state, the collector of NPN transistor 60 is clamped to the negative forward drop, i.e., −0.6 V dc, of clamping diode 66. The normal conducting state of NPN transistor 60 is due to the base current $I_B$ produced by the positive voltage source through resistor 56. However, when either NPN transistor 46 or 52 is in a conducting state, current from the positive voltage source passes through the conducting NPN transistor(s) 46, 52 to the negative voltage source, causing the base current $I_B$ to go to zero value, FIGS. 2B–2D. When the base current $I_B$ goes to zero value, NPN transistor 60 goes into a non-conducting state, FIGS. 2D–2E. When NPN transistor 60 goes non-conducting, its collector voltage goes positive, FIG. 2E. This collector voltage signal is the output signal $V_O$ of the coincidence circuit 100.

Thus, referring to FIG. 2E, when phase coincidence of a.c. input signals #1 and #2 occurs (with threshold values being attained), transistor 60 is non-conducting and the output signal $V_O$ at its collector is at approximately +15 V dc. When such phase coincidence does not occur, the coincidence circuit output signal $V_O$ is at approximately −0.6 V dc. The timer 80 measures the duration of the time period when Vo is at approximately +15 V dc and produces an output signal at 81 when this duration (and, hence, such phase coincidence) continues for a predetermined minimum time.

An important advantage provided by the signal processing circuit means 12 and 14 in relation to conventional coincidence circuits for protective relay applications is that the threshold levels can be set relatively low, e.g., less than 7 volts dc. For many applications, the present invention provides threshold levels less than 0.1 V dc. Indeed, the threshold values may be set in the millivolt range. For example, in the phase distance relay of FIGS. 6, 7 of previously referenced U.S. Pat. No. 4,034,269, the threshold level for the polarizing signal ($V_{AB}$) may be set at 9 mV and the threshold level for the operating signal ($I_{AB}Z_R - V_{AB}$) may be set at 60 mV. Further, these threshold levels can be simply adjusted by varying the appropriate resistor values.

OTHER EMBODIMENTS

As mentioned previously in the Background of the Invention, for some protective relaying applications, the coincidence of more than two a.c. input signals is required to be determined. For example, in copending patent application of Ser. No. 879,653 entitled "Ground Distance Relay Employing Phase Comparator Measurement", filed Feb. 21, 1978, the phase coincidence of three or four a.c. input signals is determined for each phase of a three phase a-c power system. This copending application is assigned to the assignee of the present application and is hereby incorporated by reference in the present application.

Figure 3:
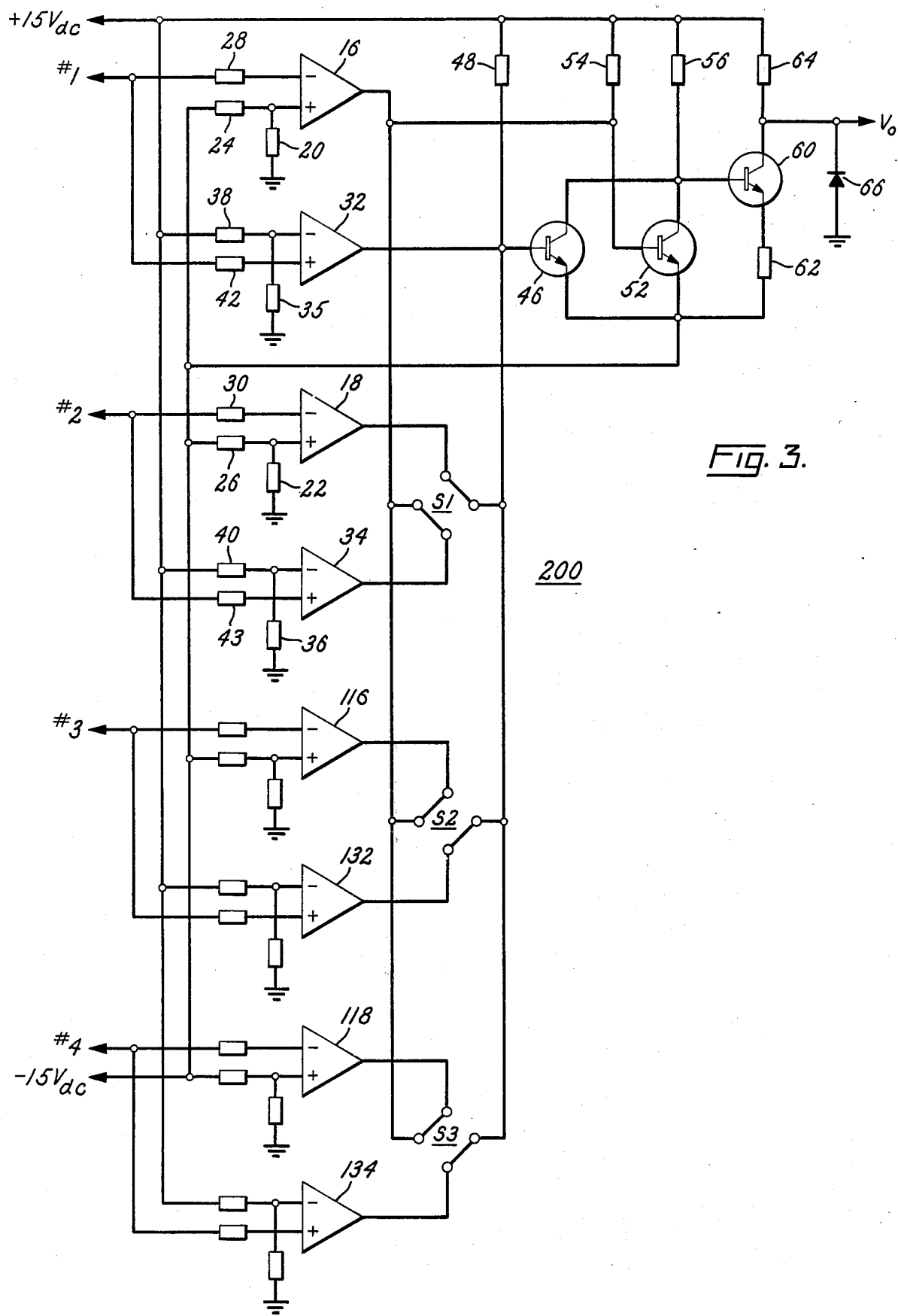
FIG. 3 is a circuit diagram of another form of a.c. coincidence circuit of the present invention.

A coincidence circuit 200 for such three or four a.c. input signals is shown in FIG. 3. For purposes of convenience, only the phase A coincidence circuit is shown, it being understood that phases B, C are substantially identical. Also, for purposes of illustration, a.c. input signals #1, #2, #3, and #4 are those shown below in Table 1. These illustrative a.c. signals are fully discussed in the referenced copending patent application of Ser. No. 879,653.

TABLE 1

| a-c input signal | Signal Designation | Signal Expression |
|---|---|---|
| #1 | #1 POLARIZING SIGNAL | $V_{BC} \angle 90°$ |
| #2 | OPERATE SIGNAL | $(I_A - I_0)Z_{R1} +$ $K_0 I_0 Z_{RO} -$ $T V_{AN}$ |
| #3 | #2 POLARIZING SIGNAL | $cK_0 I_0 Z_{RO} - V_O$ |
| #4 | CURRENT SUPERVISION SIGNAL | $I_0 Z_{RO}$ |

The four input coincidence circuit 200 of FIG. 3 is similar to the coincidence circuit 100 of FIG. 1 so that, where possible, like numerals have been employed to represent like elements.

As shown in FIG. 3, each a.c. input signal is coupled to signal processing circuit means which includes a pair of comparators, each of which produces −15 V dc output until a predetermined threshold level is attained at which point its output transistor turns off. More particularly, one member of the comparator pair determines positive threshold and the other member of the comparator pair determines the negative threshold. It may be helpful to compare the configuration of coincidence circuit 200 for the a.c. input signals #1 and #2 to the coincidence circuit 100 of FIG. 1. With such a comparison, it can be seen that an additional pair of comparators 116, 132 is provided for a.c. input signal #3 and an additional pair of comparators 118, 134 is provided for a.c. input signal #4.

The outputs of comparators 16, 32, 18, 34, 116, 132, 118, 134 are coupled through switches S1, S2, S3 to the base of NPN transistor 46 or 52. As shown in FIG. 3, the positive coincidence signal associated with the #1 input signal (from comparator 32) is coupled to the base of NPN transistor 46 and the negative coincidence signal associated with the #1 input signal (from comparator 16) is coupled to the base of NPN transistor 52. Switches S2, S3 are shown in a position such that the base of NPN transistor 46 receives the positive coincidence signal associated with a.c. input signals #3 (from comparator 132) and #4 (from comparator 134). Switch S1 is shown in a position such that the positive coincidence signal associated with a.c. input #2 (from comparator 34) is coupled to the base of NPN transistor 52 and the negative coincidence signal associated with a.c. input signal #2 (from comparator 18) is coupled to the base of NPN transistor 46. As a result of this illustrative switch position, NPN transistor 46 develops a signal (goes into a conducting state) representative of phase coincidence when the #1, #3, and #4 a.c. input signals are in positive phase (and positive threshold level attained) and the #2 a.c. input signal is in a negative phase (and negative threshold value attained). Conversely, NPN transistor 52 develops a signal representative of phase coincidence (goes into a conducting state) when the #1, #3, #4 a.c. input signals are in negative phase coincidence (and negative threshold level is attained), and the #2 a.c. input signal is in a positive phase (and positive threshold attained). As in the coincidence circuit 100, when either transistor 46 or 52 is conducting, transistor 60 is non-conducting so that the output signal $V_O$ appearing at the collector of transistor 60 is representative of the phase coincidence of a.c. input signals #1, #2, #3, #4. In the illustrative four a.c. input case, for the output signal $V_O$ to indicate phase coincidence, a.c. inputs #1, #3, #4 have the same polarity but a.c. input #2 has the opposite polarity.

It is important to note that, in the illustrative four a-c input coincidence circuit 200, the threshold levels are set at different levels for some of the a.c. input signals. For example, typical threshold levels are as follows: #1 POLARIZING SIGNAL at 600 mV; OPERATE SIGNAL at 70 mV; #2 POLARIZING SIGNAL at 125 mV; and CURRENT SUPERVISION SIGNAL at 33 mV. Such different threshold levels are important because they determine the sensitivity of each input quantity, and hence, the overall characteristic of the relay.

The coincidence circuit 200 of FIG. 3 and its switching means is suitable for many protective relay applications where the phase coincidence of a plurality of a.c. input signals is required to be determined. For example, it is suitable for use in distance relay measuring techniques.

Further, the adjustable threshold levels of the coincidence circuits 100, 200 provide capability for asymmetrical threshold levels, i.e., unequal positive and negative threshold levels for a given a-c input signal.

GENERAL CONSIDERATIONS

Circuit devices which can be employed to practice the coincidence circuits of the present invention may include the following: comparators such as the one commercially available from National Semi-Conductor Corp. under the designation LM239; and transistors such as the one commercially available from Motorola under the designation 2N2222A.

Further, although the coincidence circuits of the present invention have been described employing certain circuit devices and circuit configurations, substitutions may be made thereto. For example, PNP transistors may be substituted for the NPN transistors as long as polarity considerations are maintained. Also, operational amplifiers, or discrete transistors, could be used for level detectors in place of the comparators.

While I have shown and described particular embodiments of my invention, it will be obvious to those skilled in the art that various changes and modifications may be made without departing from my invention in its broader aspects, and I, therefore, intend herein to cover all such changes and modifications as fall within the true spirit and scope of my invention.

What I claim as new and desire to secure by Letters Patent of the United States is:

1. In a protective relay circuit of the type employing a timer circuit and, a coincidence circuit for receiving a plurality of a.c. input signals and developing a coincidence output signal representative of the phase coincidence of the plurality of a.c. input signals, which coincidence circuit comprises:
- (a) negative signal processing means including:
  - (i) first level detector circuit means for developing a separate first level detector output signal for each one of said plurality of a.c. input signals when each one of said plurality a.c. input signals is of a negative value greater than a predetermined negative threshold value, said predetermined negative threshold value being of a different value for at least some of said a.c. input signals,
  - (ii) first AND circuit means for receiving said first level detector output signals and developing a first AND output signal representative of negative phase coincidence of said plurality of a.c. input signals wherein said plurality of a.c. input signals are each of a negative value greater than said predetermined negative threshold values,
- (b) positive signal processing means including:
  - (i) second level detector circuit means for developing a separate second level detector output signal for each one of said plurality of a.c. input signals when each one of said plurality of a.c. input signals is of a positive value greater than a predetermined positive threshold value, said predetermined positive threshold value being of a different value for at least some of said a.c. input signals,
  - (ii) second AND circuit means for receiving said second level detector output signals and developing a second AND output signal representative of positive phase coincidence of said plurality of a.c. input signals wherein said plurality of a.c. input signals are each of a positive value greater than said predetermined positive threshold values, and
- (c) OR circuit means coupled to receive said first and second AND output signals for developing an OR circuit output signal in response to said first or second AND output signal, said OR circuit output signal being representative of the phase coincidence of said plurality of a.c. input signals wherein said predetermined negative and positive threshold values are exceeded for the respective negative and positive portions of said a.c. input signals, said OR circuit output signal being coupled to a timer circuit which measures the duration of said OR circuit output signal and develops an output signal when the phase coincidence occurs for a predetermined minimum time.

2. A coincidence circuit in accordance with claim 1 in which at least some of said predetermined threshold values are less than about 7 volts dc.

3. A coincidence circuit in accordance with claim 2 in which at least some of said predetermined threshold values are less than about 0.1 volt dc.

4. A coincidence circuit in accordance with claim 1 for receiving three a-c input signals in which said OR circuit output signal is representative of the phase coincidence of said three a-c input signals.

5. A coincidence circuit in accordance with claim 1 for receiving four a-c input signals in which said OR circuit output signal is representative of the phase coincidence of said four a-c input signals.

6. A coincidence circuit in accordance with claim 1 in which at least some of said first and second level detector output signals are coupled to said first and second AND circuit means through switching means.

7. A coincidence circuit in accordance with claim 6 in which said switching means includes means for coupling at least one of said level detector output signals indicating threshold attainment of one polarity to said AND circuit means which develops said AND output signal representative of phase coincidence of the opposite polarity such that said OR circuit output signal is representative of opposite phase coincidence of at least some of said input signals.

8. A coincidence circuit in accordance with claim 1 in which,
said negative signal processing means includes a plurality of first comparators, one of said comparators being provided for each one of said a-c input signals, each of said comparators including a non-inverting input, an inverting input, and an output, the non-inverting inputs being coupled through separate first resistors to ground potential, the non-inverting inputs being coupled to a source of negative potential through separate second resistors, the inverting inputs being coupled through separate third resistors to receive said plurality of a-c input signals,
said positive signal processing means includes a plurality of second comparators, one of said comparators being provided for each one of said a-c input signals, each of said comparators including a non-inverting input, an inverting input, and an output, the inverting inputs being coupled through separate fourth resistors to ground potential, the inverting inputs being coupled to a source of positive potential through separate fifth resistors, the non-inverting inputs being coupled through separate sixth resistors to receive said plurality of a-c input signals, and at least some of said outputs of said first comparators being coupled together and at least some of said outputs of said second comparators being coupled together.

9. A coincidence circuit in accordance with claim 8 in which said first AND circuit means comprises a first NPN transistor having its base coupled to receive at least some of said outputs of said first comparators, said base being coupled through a seventh resistor to a source of positive potential, the emitter of said first transistor being coupled to a source of negative potential,
said second AND circuit means comprises a second NPN transistor having its base coupled to receive at least some of said outputs of said second comparators, said base being coupled through an eighth resistor to said source of positive potential, the emitter of said second transistor being coupled to said source of negative potential, and
said collectors of said first and second transistors being coupled together and through a ninth resistor to said source of positive potential.

10. A coincidence circuit in accordance with claim 9 in which said OR circuit comprises a third NPN transistor having its base coupled to said collectors of said first and second NPN transistors, the emitter of said third NPN transistor being coupled through a tenth resistor to said source of negative potential, the collector of said third NPN transistor being coupled to said source of positive potential through an eleventh resistor and coupled to ground potential through a clamping diode, wherein the signal appearing at the collector of said third NPN transistor comprises said OR circuit output signal.

11. A coincidence circuit in accordance with claim 8 in which said predetermined negative threshold values are adjustably determined by the values of said first and second resistors and the magnitude of said negative source of potential and said predetermined positive threshold values are adjustably determined by the values of said fourth and fifth resistors and the magnitude of said positive source of potential.

* * * * *